United States Patent [19]
Jang

[11] Patent Number: 5,724,296
[45] Date of Patent: Mar. 3, 1998

[54] SELF-REFRESHABLE DUAL PORT DYNAMIC CAM CELL AND DYNAMIC CAM CELL ARRAY REFRESHING CIRCUIT

[75] Inventor: Hyun Sik Jang, Kyoungki-do, Rep. of Korea

[73] Assignee: Hyundai Electronics Industries Co., Ltd., Kyoungki-do, Rep. of Korea

[21] Appl. No.: 813,186

[22] Filed: Mar. 10, 1997

Related U.S. Application Data

[62] Division of Ser. No. 500,224, Jul. 10, 1995, Pat. No. 5,642,320.

[30] Foreign Application Priority Data

Jul. 11, 1994 [KR] Rep. of Korea ............ 94-16657

[51] Int. Cl.$^6$ .............................................. G11C 15/00
[52] U.S. Cl. .................. 365/222; 365/149; 365/190; 365/189.07; 365/230.05
[58] Field of Search ........................ 365/222, 149, 365/190, 189.07, 230.05

[56] References Cited

U.S. PATENT DOCUMENTS

| | | | |
|---|---|---|---|
| 4,780,845 | 10/1988 | Threewitt. | |
| 4,965,767 | 10/1990 | Kinoshita et al. | 365/49 |
| 5,051,948 | 9/1991 | Watabe et al. | |
| 5,126,968 | 6/1992 | Hamamoto et al. | 365/49 |
| 5,319,589 | 6/1994 | Yamagata et al. | 365/49 |
| 5,642,320 | 6/1997 | Jang | 365/222 |

FOREIGN PATENT DOCUMENTS 3-160694  7/1991  Japan.
5-298891  11/1993  Japan.

*Primary Examiner*—Viet Q. Nguyen
*Attorney, Agent, or Firm*—Morgan & Finnegan, LLP

[57] ABSTRACT

A self-refreshable dual port dynamic CAM cell which performs a self-refresh operation with no effect on a data read operation and no reduction in performance. The dynamic CAM cell comprises first and second MOS transistors for storing first true and complementary bit data from first true and complementary bit lines, respectively, third and fourth MOS transistors for transferring the data stored in the first and second MOS transistors to a match line in response to the first true and complementary bit data from the first true and complementary bit lines, respectively, a fifth MOS transistor for storing the first true bit data from the first true bit line into the first MOS transistor in response to a signal from a first word line, a sixth MOS transistor for storing the first complementary bit data from the first complementary bit line into the second MOS transistor in response to the signal from the first word line, a seventh MOS transistor for refreshing the data stored in the first MOS transistor with second true bit data from a second true bit line in response to a signal from a second word line, and an eighth MOS transistor for refreshing the data stored in the second MOS transistor with second complementary bit data from a second complementary bit line in response to the signal from the second word line.

1 Claim, 5 Drawing Sheets

SELF-REFRESHABLE DUAL PORT DYNAMIC CAM CELL AND DYNAMIC CAM CELL ARRAY REFRESHING CIRCUIT

This is a divisional of application Ser. No. 08/500,224 filed Jul. 10, 1995 U.S. Pat. No. 5,642,320.

BACKGROUND OF THE INVENTION

1. Field of the Invention

The present invention relates in general to a content addressable memory (referred to hereinafter as CAM) cell and a CAM cell array used in a cache memory and a variable length coder in a digital system, and more particularly to a self-refreshable dual port dynamic CAM cell having a minimized, occupied area and a dynamic CAM cell array refreshing circuit.

2. Description of the Prior Art

Generally, a CAM cell is used in a cache memory, a programmable variable length decoder and a reprogrammable programmable logic array (PLA) in a digital system. A CAM uses a dynamic memory cell to make a cell size smaller when a memory cell array size is larger. The dynamic memory cell requires a refresh operation.

A main function of the CAM is to find a match address corresponding to the memory contents, whereas a main function of a general dynamic random access memory (referred to hereinafter as DRAM) is to write and read data. It is very hard to insert a refresh cycle in the middle of performing the above functions. In the case where the refresh cycle is inserted in the middle of performing the above functions, a very complex control system is required or a system including the dynamic CAM cell is reduced in performance. The refresh operation is more frequently performed in the CAM of the dynamic type rather than the DRAM because the CAM has a much smaller storage capacity than that of the DRAM. The dynamic CAM cell can perform a self-refresh operation to have an external static operating characteristic, without requiring an external refresh operation. However, the self-refresh operation of the dynamic CAM cell has a disadvantage in that it has an effect on a data read operation. For reference, the self-refresh operation of the dynamic CAM cell will hereinafter be described with reference to FIG. 1.

Referring to FIG. 1, there is shown a circuit diagram of a conventional dynamic CAM cell. At the initial state, data are written in dynamic storage nodes a and b, and a match line 17 is precharged with a high voltage. When a match operation is performed by the CAM after the data are stored in the dynamic storage nodes a and b, a word line 15 becomes "0" in logic, thereby causing no further data to be written in the dynamic storage nodes a and b. Then, data to be compared are supplied to true and complementary bit lines 11 and 13.

In the case where the data stored in the dynamic storage nodes a and b are the same as those on the true and complementary bit lines 11 and 13, the match line 17 maintains the initially precharged high voltage. On the contrary, in the case where the data stored in the dynamic storage nodes a and b are not the same as those on the true and complementary bit lines 11 and 13, the match line 17 is discharged to "0" in logic. For example, provided that high data is supplied to the true bit line 11 and low data is supplied to the complementary bit line 13 at the initial state, low data is stored in the dynamic storage node a and high data is stored in the dynamic storage node b. If a high value is supplied to the true bit line 11 and a low value is supplied to the complementary bit line 13 during the match operation, MOS transistors Q2 and Q3 are turned off, thereby causing the match line 17 to maintain a high impedance or the initially precharged high voltage. On the contrary, if a low value is supplied to the true bit line 11 and a high value is supplied to the complementary bit line 13 during the match operation, the MOS transistor Q3 and a MOS transistor Q4 are turned on, thereby causing the match line 17 to be discharged to a low value.

In order to refresh the dynamic storage nodes a and b in FIG. 1, a refresh cycle must be inserted between the normal operations or the match operations of the CAM to turn on the word line 15 and supply address data to the true and complementary bit lines 11 and 13. In this manner, the refresh operation of the dynamic CAM cell can be accomplished.

However, the dynamic storage nodes of the dynamic CAM cell can perform a data read operation during the normal match operation. The data read operation of the dynamic CAM cell is affected by the refresh operation.

SUMMARY OF THE INVENTION

Therefore, the present invention has been made in view of the above problem, and it is an object of the present invention to provide a self-refreshable dual port dynamic CAM cell which is capable of performing a self-refresh operation without any effect on a data read operation of dynamic storage nodes.

It is another object of the present invention to provide a circuit for refreshing a dual port dynamic CAM cell array.

In accordance with one aspect of the present invention, there is provided a self-refreshable dual port dynamic CAM cell comprising a first most transistor for storing first true bit data from a first true bit line; a second MOS transistor for storing first complementary bit data from a first complementary bit line; a third MOS transistor for transferring the first true bit data stored in the first MOS transistor to a match line in response to the first true bit data from the first true bit line; a fourth MOS transistor for transferring the first complementary bit data stored in the second MOS transistor to the match line in response to the first complementary bit data from the first complementary bit line; a fifth MOS transistor for storing the first true bit data from the first true bit line into the first MOS transistor in response to a signal from a first word line; a sixth MOS transistor for storing the first complementary bit data from the first complementary bit line into the second MOS transistor in response to the signal from the first word line; a seventh MOS transistor for refreshing the first true bit data stored in the first MOS transistor with second true bit data from a second true bit line in response to a signal from a second word line; and an eighth MOS transistor for refreshing the first complementary bit data stored in the second MOS transistor with second complementary bit data from a second complementary bit line in response to the signal from the second word line.

In accordance with another aspect of the present invention, there is provided a dynamic CAM cell array refreshing circuit comprising a dynamic CAM cell array including a plurality of self-refreshable dual port dynamic CAM cells; first word line drive means for generating write addresses to drive first word lines of the dynamic CAM cell array to store initial data into the dynamic CAM cell array; refresh word line drive means for generating addresses to drive second word lines of the dynamic CAM cell array to refresh the dynamic CAM cell array; clock generation means for generating a clock necessary to a refresh operation; refresh control means for adjusting the clock from the clock generation means according to an initial data write mode and a normal operation mode and supplying the adjusted clock to the refresh word line drive means; refresh sense amplification means for sensing data on a bit line of each of the plurality of dynamic CAM cells in the dynamic CAM cell array and refreshing the sensed data; and data input means for supplying data to be stored in the dynamic CAM cell array and data to be compared therewith to the dynamic CAM cell array.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
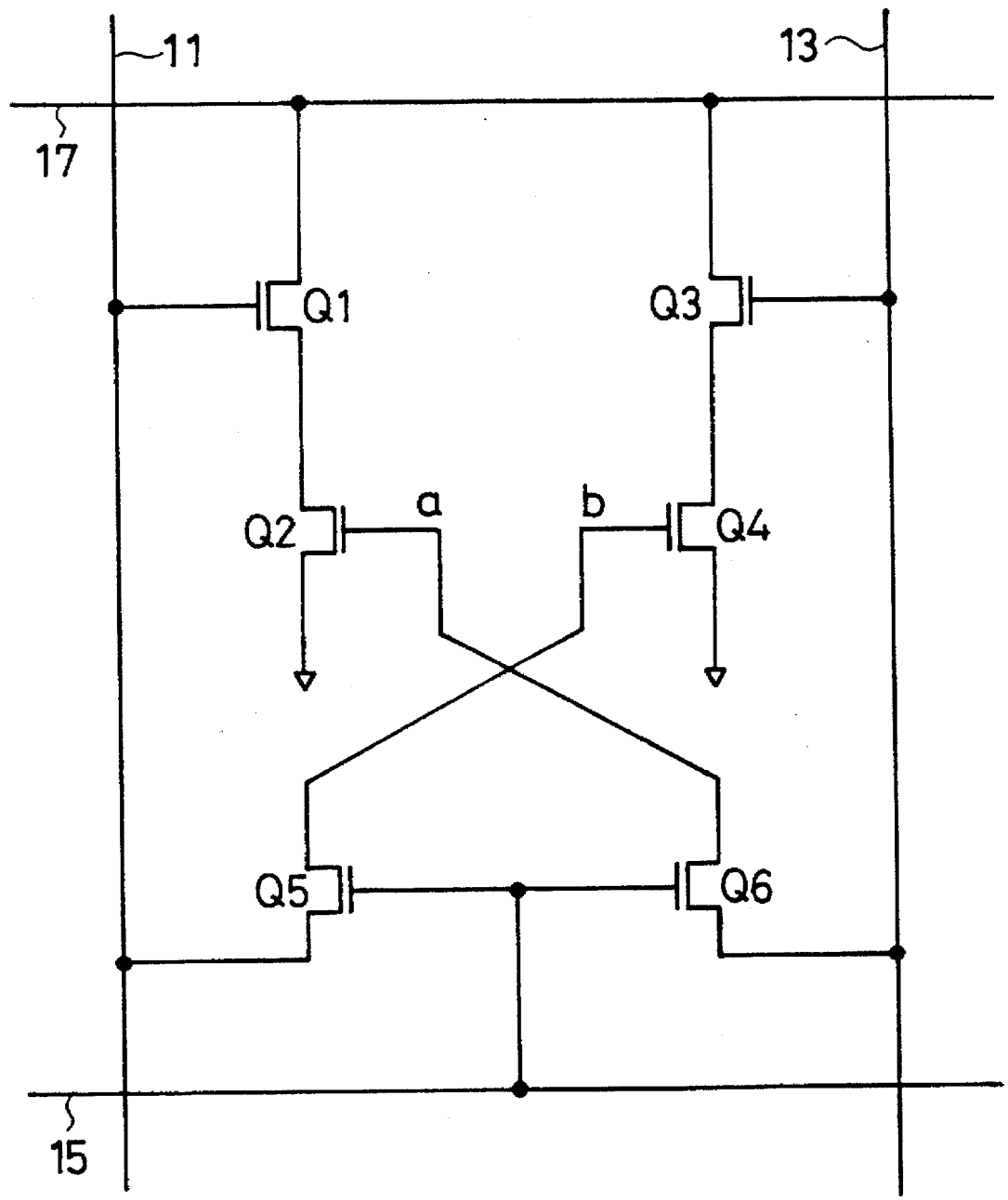
FIG. 1 is a circuit diagram of a conventional dynamic CAM cell.
Figure 2:
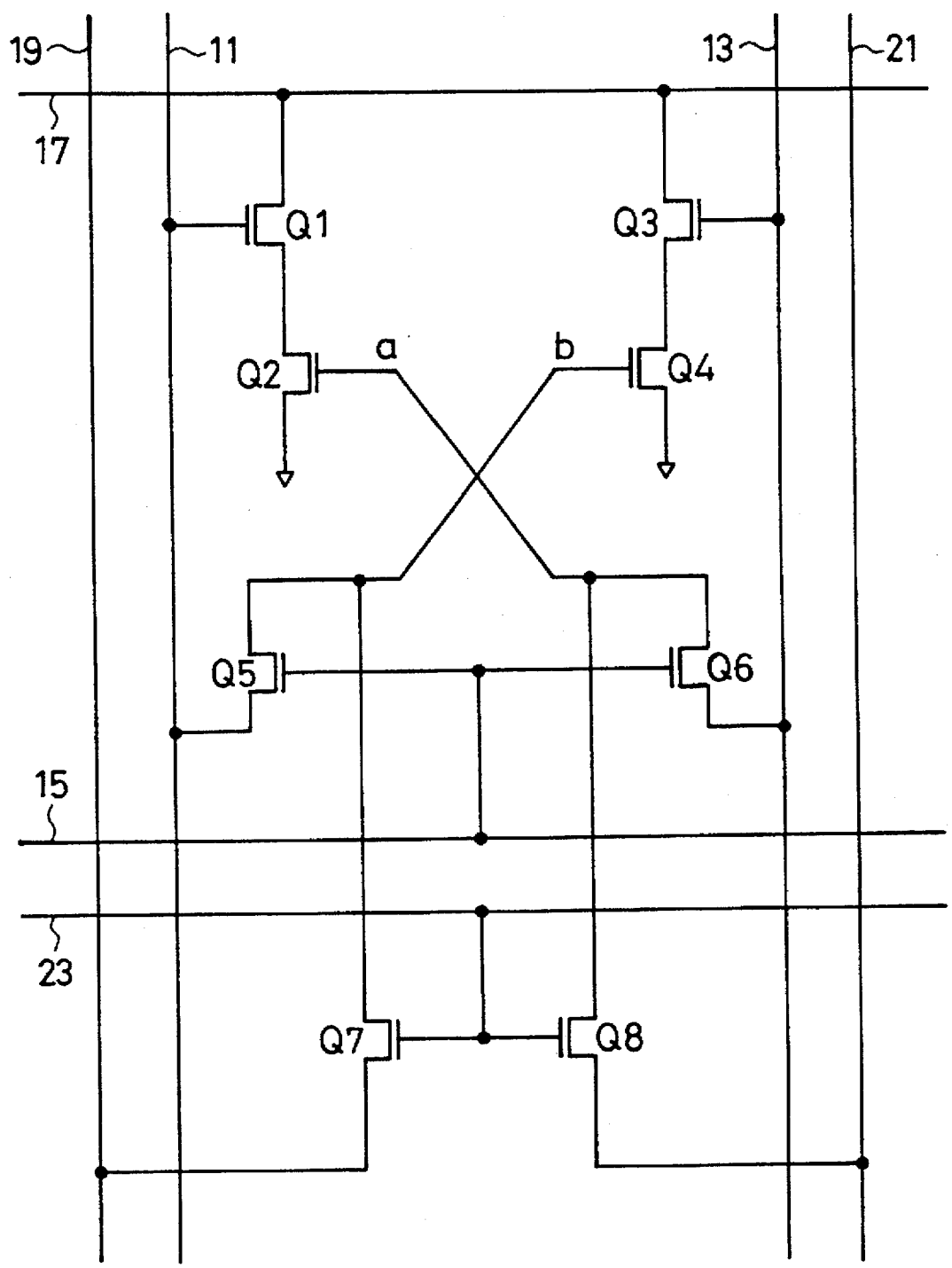
FIG. 2 is a circuit diagram of a self-refreshable dual port dynamic CAM cell in accordance with an embodiment of the present invention.

Referring to FIG. 2, there is shown a circuit diagram of a self-refreshable dual port dynamic CAM cell in accordance with an embodiment of the present invention. As shown in this drawing, the dynamic CAM cell comprises first and second NMOS transistors connected in series between a match line 17 and a ground voltage source Vss, and third and fourth NMOS transistors Q3 and Q4 connected in series between the match line 17 and the ground voltage source Vss. The first and second NMOS transistors Q1 and Q2 function to compare true data on a first true bit line 11 with data stored in a first dynamic storage node a. When the true data on the first true bit line 11 and the data in the first dynamic storage node a are both "1" in logic, the match line 17 is charged with a ground voltage from the ground voltage source Vss which is "0" in logic. The first NMOS transistor Q1 has a gate for inputting the true data on the first true bit line 11 and the second NMOS transistor Q2 has a gate for inputting the data in the first dynamic storage node a. The first NMOS transistor Q1 connects the match line 17 to the second NMOS transistor Q2 when the true data on the first true bit line 11 is high in logic. The second NMOS transistor Q2 supplies the ground voltage from the ground voltage source Vss to the match line 17 through the first NMOS transistor Q1 when the data in the first dynamic storage node a is high in logic.

The third and fourth NMOS transistors Q3 and Q4 function to compare complementary data on a first complementary bit line 13 with data stored in a second dynamic storage node b. When the complementary data on the first complementary bit line 13 and the data in the second dynamic storage node b are both "1" in logic, the match line 17 is charged with the ground voltage from the ground voltage source Vss which is "0" in logic. The third NMOS transistor Q3 has a gate for inputting the complementary data on the first complementary bit line 13 and the fourth NMOS transistor Q4 has a gate for inputting the data in the second dynamic storage node b. The third NMOS transistor Q3 connects the match line 17 to the fourth NMOS transistor Q4 when the complementary data on the first complementary bit line 13 is high in logic. The fourth NMOS transistor Q4 supplies the ground voltage from the ground voltage source Vss to the match line 17 through the third NMOS transistor Q3 when the data in the second dynamic storage node b is high in logic.

The dynamic CAM cell further comprises fifth and sixth NMOS transistors Q5 and Q6 being driven in response to a first word line drive signal from a first word line 15. The fifth NMOS transistor Q5 has a gate for inputting the first word line drive signal from the first word line 15. When the first word line drive signal from the first word line 15 is high in logic, the fifth NMOS transistor Q5 performs a bidirectional data transfer between the first true bit line 11 and the second dynamic storage node b. Similarly, the sixth NMOS transistor Q6 has a gate for inputting the first word line drive signal from the first word line 15. When the first word line drive signal from the first word line 15 is high in logic, the sixth NMOS transistor Q6 performs a bidirectional data transfer between the first complementary bit line 13 and the first dynamic storage node a. The match line 17 is precharged with a high voltage when the fifth and sixth NMOS transistors Q5 and Q6 are driven.

the dynamic CAM cell further comprises seventh and eighth NMOS transistors Q7 and Q8 being driven in response to a second word line drive signal from a second word line 23. The seventh NMOS transistor Q7 has a gate for inputting the second word line drive signal from the second word line 23. When the second word line drive signal from the second word line 23 is high in logic, the seventh NMOS transistor Q7 performs a bidirectional data transfer between a second true bit line 19 and the second dynamic storage node b. Similarly, the eighth NMOS transistor Q8 has a gate for inputting the second word line drive signal from the second word line 23. When the second word line drive signal from the second word line 23 is high in logic, the eighth NMOS transistor Q8 performs a bidirectional data transfer between a second complementary bit line 21 and the first dynamic storage node a. The second true and complementary bit lines 19 and 21 are used to refresh the data in the second and first dynamic storage nodes b and a, respectively. The second true and complementary bit lines 19 and 21 are also connected to a refresh sense amplifier, not shown. The second word line drive signal from the second word line 23 becomes high in logic when the data in the first and second dynamic storage nodes a and b are to be refreshed.

Figure 3:
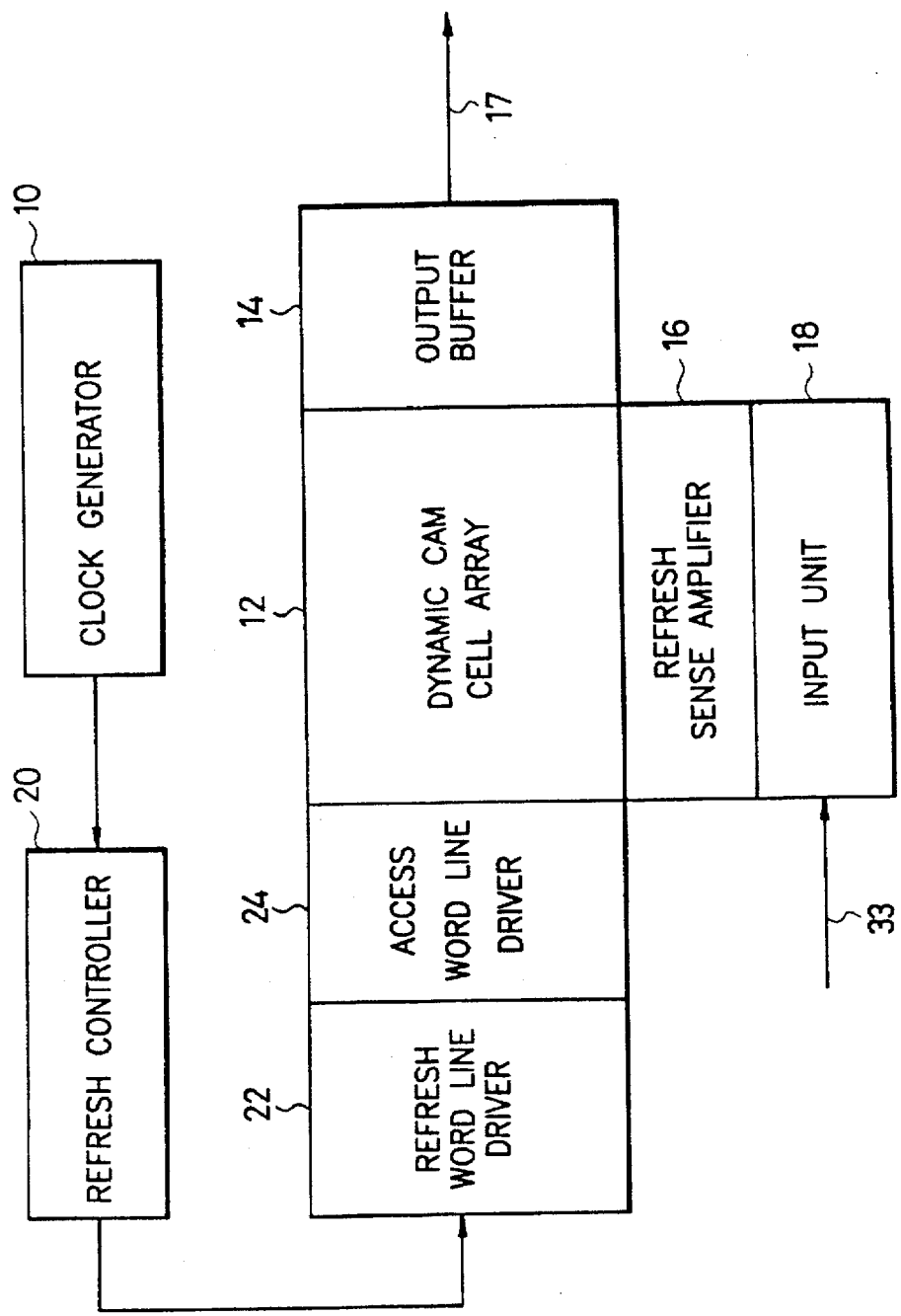
FIG. 3 is a block diagram of a circuit for refreshing a dual port dynamic CAM cell array in accordance with the embodiment of the present invention.

Referring to FIG. 3, there is shown a block diagram of a dynamic CAM cell array refreshing circuit in accordance with the embodiment of the present invention. As shown in this drawing, the dynamic CAM cell array refreshing circuit comprises a refresh sense amplifier 16 and an input unit 18 connected in common to a dynamic CAM cell array 12 which includes a plurality of self-refreshable dual port dynamic CAM cells. As previously stated with reference to FIG. 2, each of the dynamic CAM cells includes refresh bit and word lines, access bit and word lines and a match line. The input unit 18 acts to input external data from an input line 33, amplify the inputted data and transfer the amplified data to the access bit lines of the dynamic CAM cell array 12. The refresh sense amplifier 16 acts to sense and amplify data on the refresh bit lines of the dynamic CAM cell array 12.

The dynamic CAM cell array refreshing circuit further comprises a refresh word line driver 22 and a refresh controller 20 connected in series between the refresh word line of the dynamic CAM cell array 12 and a clock generator 10. The clock generator 10 acts to generate a clock pulse train necessary to a refresh operation and supply the generated clock pulse train to the refresh controller 20. The refresh controller 20 acts to adjust the clock pulse train from the clock generator 10 to generate a word line drive signal. The refresh controller 20 selectively supplies the generated word line drive signal to the refresh word line driver 22 and an access word line driver 24 according to an initial data write mode and a normal operation mode. In response to the word line drive signal from the refresh controller 20, the refresh word line driver 22 drives the refresh word line of the dynamic CAM cell array 12 so that the dynamic CAM cells in the dynamic CAM cell array 12 can be refreshed. Also, the refresh word line driver 22 controls the operation of the refresh sense amplifier 16 using a clock signal inputted with the word line drive signal from the refresh controller 20. Similarly, in response to the word line drive signal from the refresh controller 20, the access word line driver 24 drives the access word line of the dynamic CAM cell array 12 so that the data from the input unit 18 can be stored in the dynamic CAM cells in the dynamic CAM cell array 12. The refresh word line driver 22 inputs the word line drive signal from the refresh controller 20 in the normal operation mode and the access word line driver 24 inputs the word line drive signal from the refresh controller 20 in the initial data write mode.

The dynamic CAM cell array refreshing circuit further comprises an output buffer 14 for buffering an output signal from the dynamic CAM cell array 12. The output buffer 14 acts to buffer a signal from the match line of the dynamic CAM cell array 12 and transfer the buffered signal to an output line 17. Alternatively, the output buffer 14 may buffer data from the access bit lines of the dynamic CAM cell array 12 and output the buffered data externally.

The refresh operation of the dynamic CAM cell will hereinafter be described in detail with reference to FIGS. 2 and 3.

The refresh operation of the dynamic CAM cell can be performed in the normal operation mode. Namely, in the normal operation mode, no data is read from the dynamic CAM cell, and an external data input route and an input route to the refresh sense amplifier are separated from each other.

The self-refresh operation of the dynamic CAM cell can be performed in the dual port manner because it is not required in the normal operation mode to write data into the CAM. Namely, since the second word line 23 in FIG. 2 is low in logic, all the dynamic CAM cells in the dynamic CAM cell array 12 require no adjustment between data write and read operations of a dual port memory such as a first-in-first-out (FIFO) memory. In brief, when the refresh operation is performed in the normal operation mode, the refresh word line driver 22 is enabled and a word line decoding operation is performed synchronously with a clock from the clock generator 10. Namely, whenever a clock is triggered, the dynamic CAM cell array 12 is sequentially addressed beginning with its first location so that it can be refreshed.

As mentioned above, the dual port dynamic CAM cell performs the normal operation and the refresh operation separately because it has the dual port. A ring oscillator frequency generated from the clock generator 10 is determined according to a refresh time desired by the dynamic CAM cell. The refresh controller 20 disables the clock from the clock generator 10 at the initial state in which the data are written into the dynamic CAM cell array 12. For the refresh operation under the normal state, the refresh controller 20 supplies the clock from the clock generator 10 to the refresh word line driver 22. In this case, the refresh controller 20 acts to provide a word line signal corresponding to a refresh active address. Alternatively, the refresh controller 20 may act to divide the clock from the clock generator 10. A refresh cycle is substantially long (usually msec unit). For this reason, in the case where the refresh cycle is embodied using a ring oscillator circuit, a very long delay must be obtained by the circuit. In view of a VLSI impedance, it is more efficient that the clock generator 10 generates a high frequency and the refresh controller 20 divides the high frequency from the clock generator 10 and controls the refresh operation in accordance with the divided frequency. When one address of the dynamic CAM cell array 12 is made active by the refresh word line driver 22, the second word line 23 in FIG. 2 becomes high in logic, thereby causing the data stored in the first and second dynamic storage nodes a and b to be outputted through the second true and complementary bit lines 19 and 21. The outputted feeble data are sensed and then refreshed to the first and second dynamic storage nodes a and b through the second true and complementary bit lines 19 and 21.

The dual port dynamic CAM cell can support four functions in all, a function of comparing input data with stored data "1", a function of comparing the input data with stored data "0", a don't care function and an unmatch function. The don't care function is the recognize that input data to be compared was matched regardless of any of data "1" and "0". The unmatch function is to output the input data to the match line as being unmatched regardless of any of data "1" and "0". Usually, the dual port dynamic CAM cell can support all the four functions, whereas a memory cell of the static type must have a very large size to support the don't care function and the unmatch function. That is, the first and second dynamic storage nodes a and b in FIG. 2 must initially store data "0" and "0" in the case of the don't care function and data "1" and "1" in the case of the unmatch function, respectively. For this reason, in the case where the dynamic CAM cell is used only to support the comparison of the data "1" and "0", the second true and complementary bit lines 19 and 21 in FIG. 2 may be refreshed by using a refresh sense amplifier of the type different from the refresh sense amplifier 16 in FIG. 3. However, in the case where the dynamic CAM cell is used to support one of the don't care function and the unmatch function or both them, the second true and complementary bit lines 19 and 21 in FIG. 2 can be refreshed by using the refresh sense amplifier 16 in FIG. 3.

Figure 4:
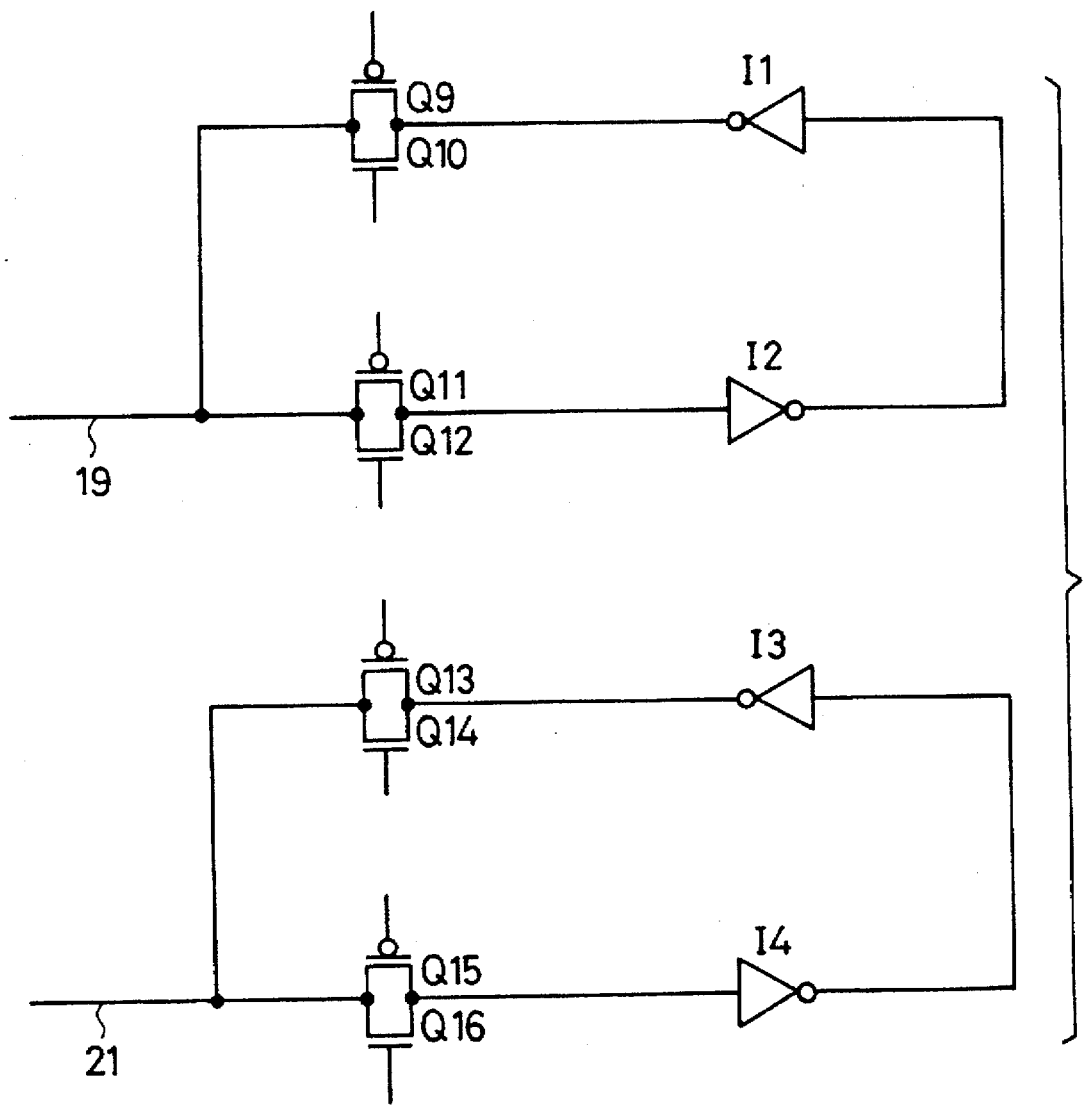
FIG. 4 is a detailed circuit diagram of a refresh sense amplifier in FIG. 3.
Figure 5:
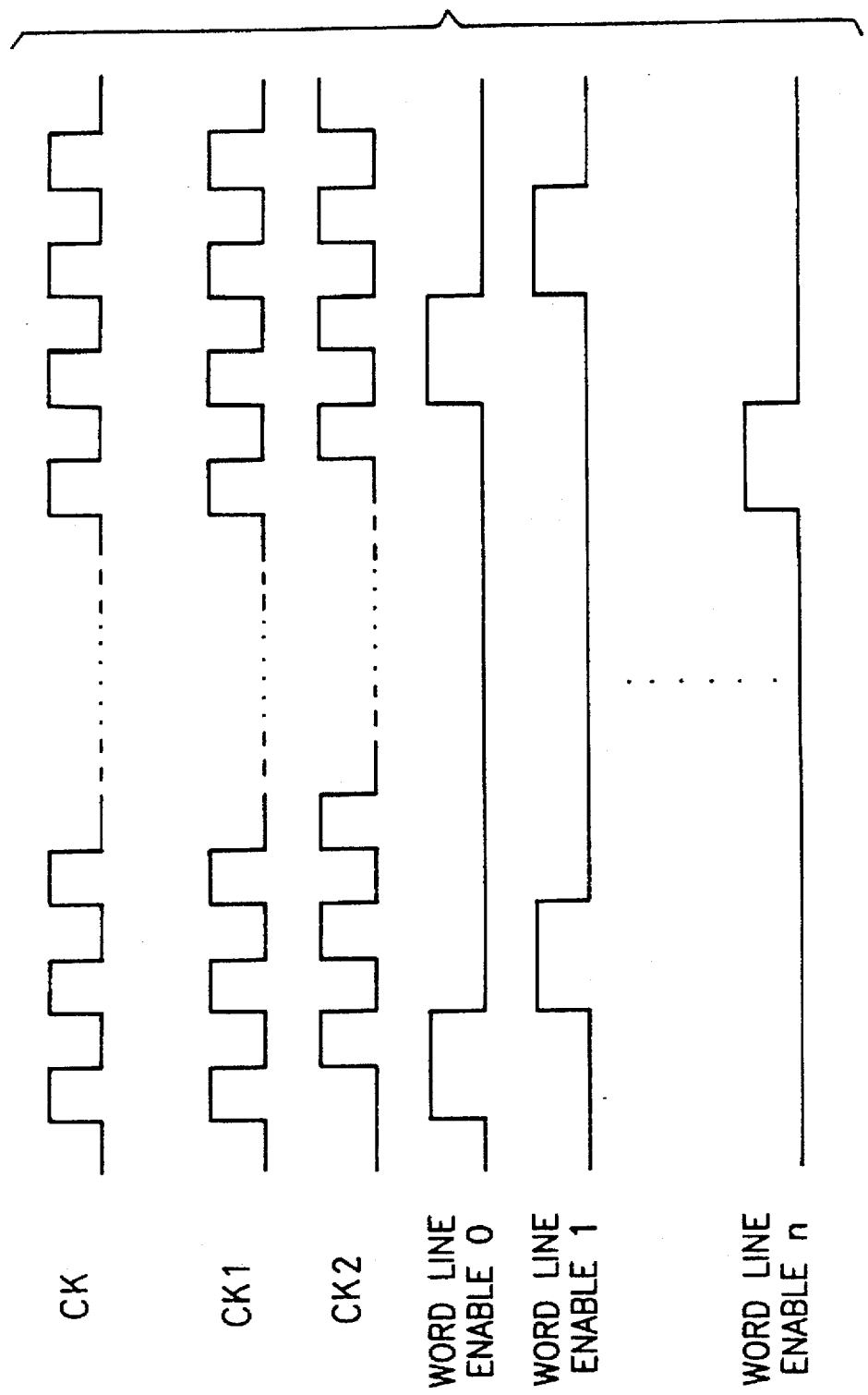
FIG. 5 is a timing diagram illustrating the operation of the refresh sense amplifier in FIG. 4.

Referring to FIG. 4, there is shown a detailed circuit diagram of the refresh sense amplifier 16 in FIG. 3. In this drawing, clocks CK1 and CK2 are dual phase clocks which are produced on the basis of a refresh clock CK used for the sequential address decoding in the refresh word line driver 22. The clocks CK1 and CK2 have an operating timing as shown in FIG. 5. As shown in FIG. 5, the second word lines 23 for the refresh operation are sequentially made active beginning with an address 0 in response to the refresh clock CK, a high duration of which is defined as the clock CK1 and a low duration of which is defined as the clock CK2. In result, the refresh sense amplifier in FIG. 4 is controlled based on the dual phase clocks CK1 and CK2.

When MOS transistors Q11–Q14 are turned on at the initial state, the refresh sense amplifier senses very rapidly a voltage on the second complementary bit line 21 according to a charging amount based on a capacity of the second true bit line 19 and input capacities of inverters I2 and I4. When MOS transistors Q9, Q10, Q15 and Q16 are turned on, the sensed voltage on the second complementary bit line 21 is again written into the second true bit line 19 to refresh the dynamic CAM cell of the active address.

As apparent from the above description, according to the present invention, the self-refreshable dual port dynamic CAM cell has a small, occupied area and requires no separate refresh interval. Therefore, the self-refreshable dual port dynamic CAM cell of the present invention can perform the self refresh operation with no reduction in performance. Further, the self-refreshable dual port dynamic CAM cell of the present invention performs the normal operation and the refresh operation individually without requiring a separate refresh cycle. Moreover, the present invention has the effect of minimizing an occupied area of a CAM cell array which requires the don't care operation and the unmatch operation and is large in scale.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A dynamic CAM cell array refreshing circuit comprising:

a dynamic CAM cell array including a plurality of self-refreshable dual port dynamic CAM cells;

first word line drive means for generating write addresses to drive first word lines of said dynamic CAM cell array to store initial data into said dynamic CAM cell array;

refresh word line drive means for generating addresses to drive second word lines of said dynamic CAM cell array to refresh said dynamic CAM cell array;

clock generation means for generating a clock necessary to a refresh operation;

refresh control means for adjusting the clock from said clock generation means according to an initial data write mode and a normal operation mode and supplying the adjusted clock to said refresh word line drive means;

refresh sense amplification means for sensing data on a bit line of each of said plurality of dynamic CAM cells in said dynamic CAM cell array and refreshing the sensed data; and data input means for supplying data to be stored in said dynamic CAM cell array and data to be compared therewith to said dynamic CAM cell array.

* * * * *